United States Patent
Hanashima et al.

(10) Patent No.: US 10,504,976 B2
(45) Date of Patent: Dec. 10, 2019

(54) OLED DISPLAY DEVICE AND METHOD OF MANUFACTURING THE SAME

(71) Applicant: TIANMA JAPAN, LTD., Kawasaki, Kanagawa (JP)

(72) Inventors: Hiromu Hanashima, Kawasaki (JP); Jun Tanaka, Kawasaki (JP)

(73) Assignee: TIANMA MICROELECTRONICS CO., LTD., Longhua District, Chenzhen (CN)

( * ) Notice: Subject to any disclaimer, the term of this patent is extended or adjusted under 35 U.S.C. 154(b) by 0 days.

(21) Appl. No.: 16/004,534

(22) Filed: Jun. 11, 2018

(65) Prior Publication Data

US 2019/0006443 A1    Jan. 3, 2019

(30) Foreign Application Priority Data

Jun. 30, 2017 (JP) .................................. 2017-128626
Mar. 7, 2018 (JP) .................................. 2018-040943

(51) Int. Cl.
| H01L 27/32 | (2006.01) |
| H01L 51/00 | (2006.01) |
| H01L 51/56 | (2006.01) |
| H01L 51/52 | (2006.01) |

(52) U.S. Cl.
CPC ...... H01L 27/3246 (2013.01); H01L 27/3218 (2013.01); H01L 51/0021 (2013.01); H01L 51/56 (2013.01); H01L 27/3211 (2013.01); H01L 51/5228 (2013.01); H01L 51/5246 (2013.01); H01L 2227/323 (2013.01)

(58) Field of Classification Search
CPC ............ H01L 27/3246; H01L 27/3218; H01L 27/3211; H01L 51/0021; H01L 51/56; H01L 51/5228; H01L 51/5246; H01L 2227/323

See application file for complete search history.

(56) References Cited

U.S. PATENT DOCUMENTS

2013/0248867 A1    9/2013   Kim et al.
2017/0365646 A1*  12/2017   Bai .................... H01L 27/3211

* cited by examiner

*Primary Examiner* — Jasmine J Clark
(74) *Attorney, Agent, or Firm* — Sughrue Mion, PLLC

(57) ABSTRACT

Each of sub-pixels includes an upper electrode layer, a lower electrode layer between the upper electrode layer and the substrate, an organic light-emitting layer between the lower electrode layer and the upper electrode layer, and an interlayer between the organic light-emitting layer and the lower electrode layer. The pixel defining layer is provided between the lower electrode layer and the interlayer. The convex structural part is provided between the substrate and the interlayer. The convex structural part has a third side wall on the side of the first sub-pixel and a fourth side wall on the side of the second sub-pixel. The first side wall, the second side wall, the third side wall, and the fourth side wall have forward tapered surfaces.

12 Claims, 12 Drawing Sheets

| TEST PATTERN | LEFT TAPER ANGLE ($\theta L$) | RIGHT TAPER ANGLE ($\theta R$) | LEAKAGE PATH DIMINISHING EFFECT |
|---|---|---|---|
| 1 | 50 | 46 | NEGATIVE |
| 2 | 60 | 56 | POSITIVE |
| 3 | 66 | 70 | POSITIVE |
| 4 | 59 | 51 | NEGATIVE |
| 5 | 65 | 52 | POSITIVE |
| 6 | 64 | 58 | POSITIVE |
| 7 | 53 | 52 | NEGATIVE |
| 8 | 51 | 46 | NEGATIVE |
| 9 | 56 | 54 | NEGATIVE |

*FIG.9*

OLED DISPLAY DEVICE AND METHOD OF MANUFACTURING THE SAME

CROSS-REFERENCE TO RELATED APPLICATIONS

This Non-provisional application claims priority under 35 U.S.C. § 119(a) on Patent Application No. 2017-128626 filed in Japan on Jun. 30, 2017, and Patent Application No. 2018-040943 filed in Japan on Mar. 7, 2018 the entire contents of which are hereby incorporated by reference.

BACKGROUND

This disclosure relates to an OLED display device and a method of manufacturing the same.

The organic light-emitting diode (OLED) element is a current-driven self-light-emitting element and therefore, eliminates the necessity of backlight. In addition to this, the OLED display element has advantages of achievement of low power consumption, wide viewing angle, and high contrast ratio; it is expected to contribute to development of flat panel display devices.

A typical OLED display device includes a plurality of sub-pixels arrayed in a matrix. Each sub-pixel includes an organic light-emitting layer for emitting light in one of the colors of blue, red, and green, and a positive electrode and a negative electrode sandwiching the organic light-emitting layer. For example, US 2013/0248867 A discloses a configuration example of an OLED display device, which includes a pixel defining layer defining light-emitting regions of sub-pixels and a clamp unit having an inverse tapered shape provided on the same layer as the pixel defining layer.

SUMMARY

An aspect of this disclosure is an OLED display device including: a substrate; a plurality of sub-pixels arrayed on the substrate; a pixel defining layer provided to surround each of the plurality of sub-pixels, the pixel defining layer having a groove formed between a first sub-pixel and a second sub-pixel for different colors adjacent to each other; and a convex structural part formed in the groove, the convex structural part being distant from a first side wall of the pixel defining layer in the groove on the side of the first sub-pixel and a second side wall of the pixel defining layer in the groove on the side of the second sub-pixel. Each of the plurality of sub-pixels includes an upper electrode layer, a lower electrode layer between the upper electrode layer and the substrate, an organic light-emitting layer between the lower electrode layer and the upper electrode layer, and an interlayer between the organic light-emitting layer and the lower electrode layer. The pixel defining layer is provided between the lower electrode layer and the interlayer. The convex structural part is provided between the substrate and the interlayer. The convex structural part has a third side wall on the side of the first sub-pixel and a fourth side wall on the side of the second sub-pixel. The first side wall, the second side wall, the third side wall, and the fourth side wall have forward tapered surfaces.

It is to be understood that both the foregoing general description and the following detailed description are exemplary and explanatory and are not restrictive of this disclosure.

BRIEF DESCRIPTION OF THE DRAWINGS

FIG. 9 is a table showing the results of examining the diminishment of leakage path by measuring the current-voltage characteristics of a plurality of test patterns with a vacuum vapor deposited MgAg layer.

EMBODIMENTS

Figure 1:
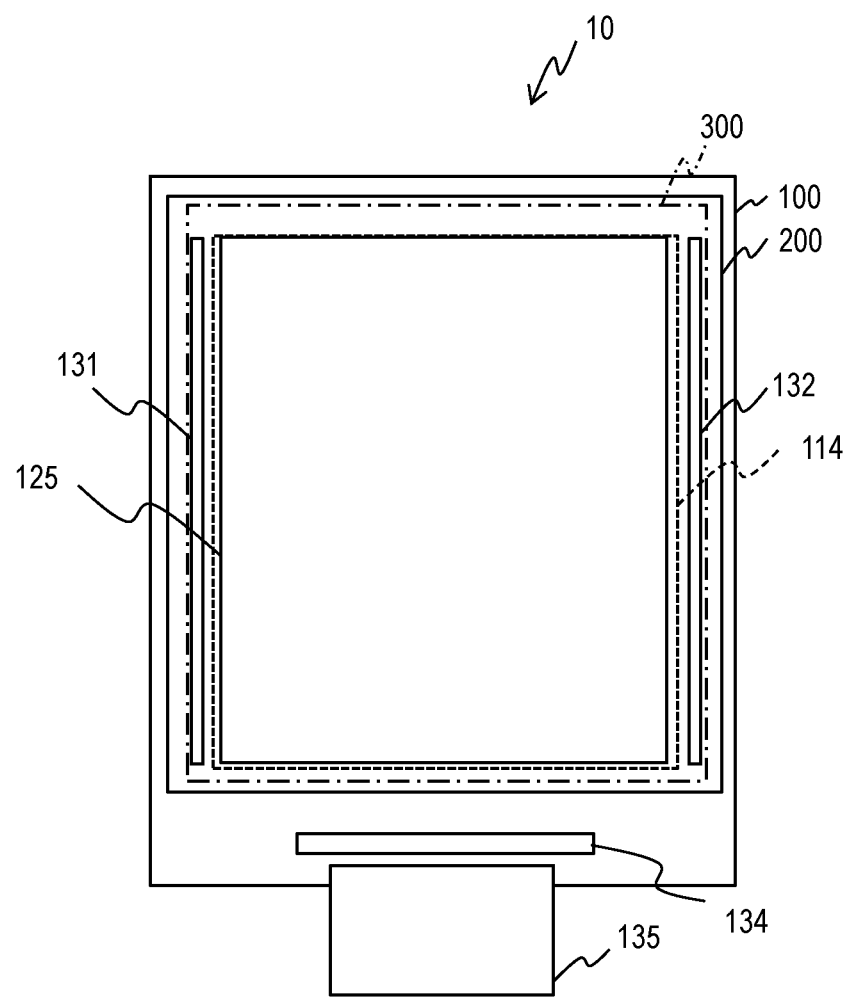
FIG. 1 schematically illustrates a configuration example of an OLED display device.

Hereinafter, a configuration of an organic light-emitting diode (OLED) display device and a method of manufacturing the OLED display device are disclosed. The inventors of the OLED display device described in this disclosure have found that, when only blue sub-pixels of the OLED display panel are lit, red and green sub-pixels sometimes slightly emit light that should not be emitted. The lighting of unintended sub-pixels reduces the chromatic purity of the displayed image, particularly causes display defect in displaying at low luminosity. Accordingly, it is desirable to prevent unintended lighting of sub-pixels.

The research by the inventors has revealed that unintended lighting of sub-pixels occurs when an interlayer having carrier transferability is provided between the electrodes and the organic light-emitting layers of sub-pixels in the entire display region of the OLED display panel. Examples of the interlayer can be a hole-injection layer and a hole transport layer.

When the voltages applied to two adjacent sub-pixels have a difference, carrier leakage through the interlayer occurs between the adjacent sub-pixels. For example, in the case of lighting only a blue sub-pixel, minute part of the current provided to the blue sub-pixel flows into the adjacent red and green sub-pixels through the interlayer. The path for the minute current is referred to as leakage path.

This minute current makes the adjacent red and green sub-pixels light slightly (so-called crosstalk). This phenomenon is more noticeable when the distance between the adjacent sub-pixels is shorter and is recognized well particularly in display at low luminosity. To prevent this carrier leakage, this disclosure describes OLED device structures that diminish or eliminate the leakage path.

The OLED display device in this disclosure includes a pixel defining layer formed to surround individual sub-pixels (the light-emitting regions thereof) and define the sub-pixels (the light-emitting regions thereof). The pixel defining layer has grooves between sub-pixels for different colors. The pixel defining layer has a side wall closer to one of the two adjacent sub-pixels and another side wall closer to the other sub-pixel in each groove. These side walls define the side of one sub-pixel and the side of the other sub-pixel of the groove.

In each groove, a convex structural part is provided. The convex structural part is distant from both of the in-groove side walls of the pixel defining layer. The convex structural part has two side walls each opposite to an in-groove side wall of the pixel defining layer. The side walls of the convex structural part in the groove have forward tapered surfaces. Furthermore, the in-groove side walls of the pixel defining layer also have forward tapered surfaces.

The interlayer of a sub-pixel between the lower electrode and the organic light-emitting layer is provided upper than the pixel defining layer and the convex structural part. The interlayer is a part of the same layer formed at once. An upper electrode (an upper electrode layer) common to all sub-pixels is provided upper than the interlayer.

In an example, each side wall of the convex structural part separates the interlayer to produce a groove in the interlayer. This configuration diminishes or eliminates the leakage path on the interlayer between adjacent sub-pixels, preventing the carrier leakage between adjacent sub-pixels for different colors.

In another example, the interlayer is not separated at the convex structural part but covers the entire surface of the groove and the side walls of the convex structural part in the groove. In the case where the interlayer between adjacent sub-pixels is not separated at the convex structural part, or in the case where the interlayer is physically continuous at the convex structural part, a leakage path is generated. Such a leakage path is long because the leakage path climbs up and down the convex structural part in the groove. In such a long leakage path, it is difficult for the carriers to flow from a sub-pixel to another through the interlayer, achieving less carrier leakage between adjacent sub-pixels for different colors.

Furthermore, the pixel defining layer and the convex structural part have forward tapered side walls within a groove of the pixel defining layer as described above. This configuration prevents the upper electrode layer common to the sub-pixels from being separated by the convex structural part.

Hereinafter, embodiments of this invention will be described with reference to the accompanying drawings. It should be noted that the embodiments are merely examples to implement this invention and are not to limit the technical scope of this invention. Elements common to the drawings are denoted by the same reference signs. The elements in the drawings may be exaggerated in size or shape for clarity of explanation.

Configuration of Display Device

FIG. 1 schematically illustrates a configuration example of an OLED display device 10 in this disclosure. The OLED display device 10 includes a thin film transistor (TFT) substrate 100 on which light emitting elements are formed, an encapsulation substrate 200 for encapsulating the OLED elements, and a bond (glass frit sealer) 300 for bonding the TFT substrate 100 with the encapsulation substrate 200. The space between the TFT substrate 100 and the encapsulation substrate 200 is filled with dry air and sealed up with the bond 300.

In the periphery of a cathode electrode forming region 114 outer than the display region 125 of the TFT substrate 100, a scanning driver 131, an emission driver 132, and a driver IC 134 are provided. These are connected to the external devices via flexible printed circuits (FPC) 135.

The scanning driver 131 drives scanning lines of the TFT substrate 100. The emission driver 132 drives emission control lines to control the emission periods of sub-pixels. The driver IC 134 can be mounted with an anisotropic conductive film (ACF).

The driver IC 134 provides power and timing signals (control signals) to the scanning driver 131 and the emission driver 132 and further, provides data voltage corresponding to image data to data lines. In other words, the driver IC 134 has a display control function.

The encapsulation substrate 200 is a transparent insulating substrate made of glass, for example. A $\lambda/4$ plate and a polarizing plate are provided over the light emitting face (front face) of the encapsulation substrate 200 to prevent reflection of light coming from the external.

Figure 2A:
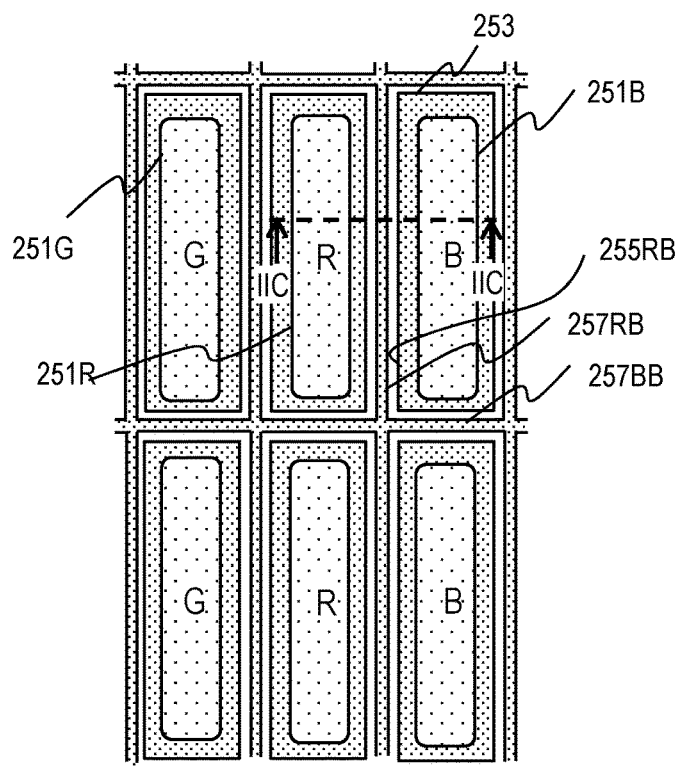
FIG. 2A is a plan diagram of a part of a display region.

FIG. 2A is a plan diagram of a part of the display region 125. FIG. 2A illustrates a plurality of sub-pixels arrayed in a matrix. FIG. 2A includes green sub-pixels (light-emitting regions) 251G, red sub-pixels (light-emitting regions) 251R, and blue sub-pixels (light-emitting regions) 251B. In the sub-pixels in FIG. 2A, only one of the red sub-pixels, one of the green sub-pixels, and one of the blue sub-pixels are denoted by reference signs. Each sub-pixel displays one of the colors of red, green, and blue. A red sub-pixel, a green sub-pixel, and a blue sub-pixel constitute one pixel (main pixel).

In the example of FIG. 2A, green sub-pixels 251G, red sub-pixels 251R, and blue sub-pixels 251B are cyclically arrayed in the row direction (the horizontal direction in FIG. 2A). In the example of FIG. 2A, a cycle of sub-pixels (light-emitting regions) for different colors consists of a green sub-pixel 251G, a red sub-pixel 251R, and a blue sub-pixel 251B disposed in this order from the left to the right. In the column direction (the vertical direction in FIG. 2A), sub-pixels for the same color are disposed.

Each sub-pixel (light-emitting region) is surrounded by a pixel defining layer 253. The pixel defining layer 253 defines individual sub-pixels (light-emitting regions). Each sub-pixel (light-emitting region) is provided in an opening of the pixel defining layer 253. The pixel defining layer 253 has grooves between sub-pixels. In FIG. 2A, the groove between a red sub-pixel 251R and a blue sub-pixel 251B is denoted by a reference sign 255RB by way of example. Furthermore, convex structural parts (ridges) are provided in the grooves of the pixel defining layer 253. In FIG. 2A, two convex structural parts are denoted by reference signs 257RB and 257BB, by way of example.

Figure 2B:
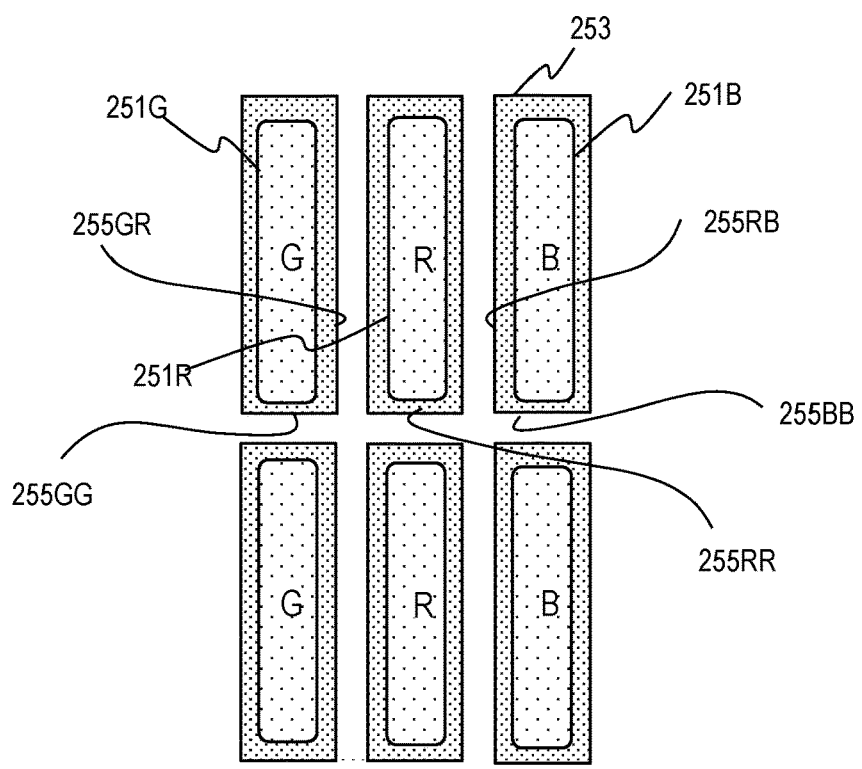
FIG. 2B schematically illustrates the configuration excluding convex structural parts from the configuration in FIG. 2A.

FIG. 2B schematically illustrates the configuration excluding the convex structural parts from the configuration in FIG. 2A. The pixel defining layer 253 has a groove between sub-pixels of each sub-pixel pair consisting of two adjacent sub-pixels for different colors. In the example of FIG. 2B, a groove 255GR is provided between a green sub-pixel 251G and a red sub-pixel 251R and a groove 255RB is provided between a red sub-pixel 251R and a blue sub-pixel 251B. FIG. 2B includes four grooves between sub-pixels for different colors and two of the grooves are denoted by 255GR and 255RB.

In the example of FIG. 2B, the pixel defining layer 253 further has a groove between sub-pixels of each sub-pixel pair consisting of two adjacent sub-pixels for the same color. In the example of FIG. 2B, a groove 255GG is provided between green sub-pixels 251G; a groove 255RR is provided between red sub-pixels 251R; and a groove 255BB is provided between blue sub-pixels 251B. The grooves between sub-pixels extend along the sides of the sub-pixels (light-emitting regions). In the example of FIG. 2B, a groove between sub-pixels is continued to other grooves. Each sub-pixel is surrounded by four grooves.

As illustrated in FIG. 2A, a convex structural part is provided in each groove. The convex structural part extends in the groove along a side of a sub-pixel (light-emitting region). In the example of FIG. 2A, the convex structural part is continued to other convex structural parts. Each sub-pixel is surrounded by four convex structural parts. Each convex structural part is distant from the pixel defining layer 253 and there is a gap between the convex structural part and the pixel defining layer 253.

Figure 2C:
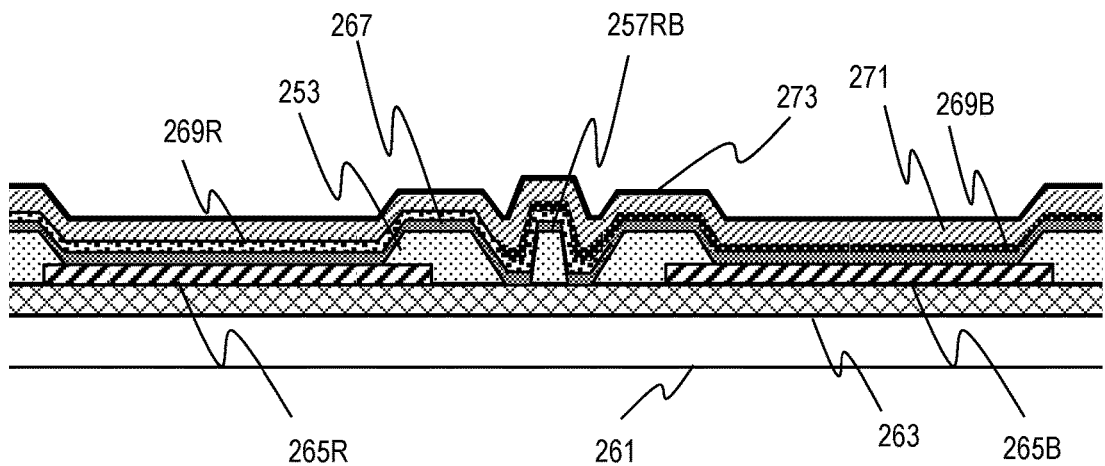
FIG. 2C is a cross-sectional diagram cut along the line IIC-IIC in FIG. 2A.

FIG. 2C is a cross-sectional diagram cut along the line IIC-IIC in FIG. 2A. The OLED display device 10 includes a TFT substrate 100 and an encapsulation substrate (transparent substrate) 200 opposed to the TFT substrate 100. FIG. 2C schematically illustrates a cross-sectional structure of the TFT substrate 100.

The OLED display device 10 includes a TFT circuit layer 263 and a plurality of separate lower electrodes (such as anode electrodes 265R and 265B) disposed on an insulating substrate 261. The separate lower electrodes are included in a lower electrode layer. The OLED display device 10 further includes an upper electrode (layer) (such as a cathode electrode (layer) 273) and a plurality of organic light-emitting layers (such as organic light-emitting layers 269R and 269B). Each layer can be one continuous area or a plurality of separate areas that are formed together. In the following description, a separate area of a layer can also be referred to as a layer.

The insulating substrate 261 is made of glass or resin, for example, and is an inflexible or flexible substrate. The side closer to the insulating substrate 261 is referred to as lower side and the side farther from the insulating substrate 261 is referred to as upper side. A not-shown cap layer may be provided above the cathode electrode (upper electrode) 273.

The anode electrodes 265R and 265B are for a red sub-pixel 251R and a blue sub-pixel 251B, respectively. The cathode electrode 273 is a transparent electrode that transmits part or all of the visible light from the organic light-emitting layers toward the encapsulation structural unit and is common to all sub-pixels.

An organic light-emitting layer is provided between the cathode electrode and one anode electrode. A plurality of anode electrodes are provided on the TFT circuit layer 263 (for example, on a planarization film thereon); one organic light-emitting layer is provided above one anode electrode. The TFT circuit layer 263 includes a plurality of sub-pixel circuits (hereinafter, simplified as pixel circuits) each including a plurality of TFTs. Each pixel circuit is formed between the insulating substrate 261 and an anode electrode to control the electric current to be supplied to the anode electrode. The anode electrode is connected with the pixel circuit through a contact provided in a contact hole in the planarization film.

Pixel circuits having any configuration can be employed. An example of a pixel circuit includes a switching TFT for selecting the sub-pixel, a driving TFT for driving the OLED element, a switching TFT for controlling supply and stop of the driving current for the OLED element, and a storage capacitor.

In FIG. 2C, an organic light-emitting layer 269R is provided between the cathode electrode 273 and the anode electrode 265R and an organic light-emitting layer 269B is provided between the cathode electrode 273 and the anode electrode 265B. The example of FIG. 2C includes organic light-emitting layers for different colors.

A lower interlayer is provided between an anode electrode and an organic light-emitting layer. In FIG. 2C, the lower interlayer 267 of each sub-pixel is a part of a layer common to the sub-pixels. The lower interlayer 267 is provided between the anode electrode 265R and the organic light-emitting layer 269R and between the anode electrode 265B and the organic light-emitting layer 269B. The lower interlayer 267 is composed of a hole-injection layer and a hole transport layer, or one layer or three or more layers having the functions of those layers.

An upper interlayer is provided between the cathode electrode and an organic light-emitting layer. In FIG. 2C, the upper interlayer 271 of each sub-pixel is a part of a layer common to the sub-pixels. The upper interlayer 271 is provided between the cathode electrode 273 and the organic light-emitting layer 269R and between the cathode electrode 273 and the organic light-emitting layer 269B. The upper interlayer 271 is composed of an electron injection layer and an electron transport layer, or one layer or three or more layers having the functions of those layers. One OLED element includes an anode electrode of a lower electrode, a lower interlayer, an organic light-emitting layer, an upper interlayer, and a cathode electrode of an upper electrode within an opening of the pixel defining layer 253.

The pixel defining layer and the convex structural parts are layers between the anode electrodes and the lower interlayer. In FIG. 2C, the pixel defining layer 253 is provided between the anode electrodes 265R and 265B and the lower interlayer 267. The convex structural part 257RB is provided between the anode electrodes 265R and 265B and the lower interlayer 267.

Figure 2D:
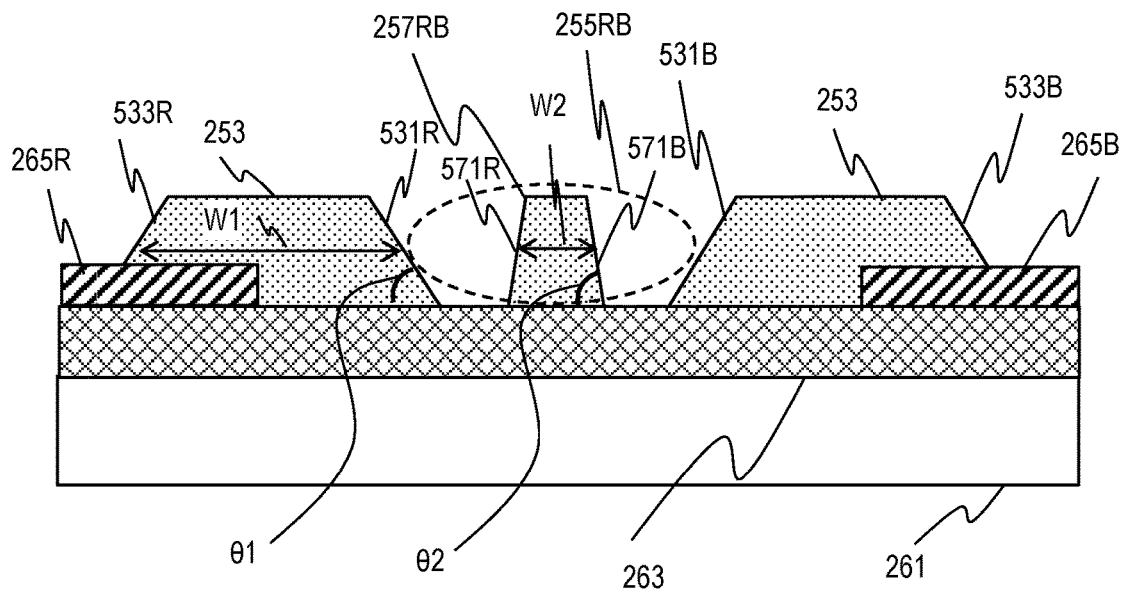
FIG. 2D is a cross-sectional diagram of the part excluding the layers upper than the pixel defining layer and the convex structural part from the configuration in FIG. 2C.

FIG. 2D is a cross-sectional diagram of the part excluding the layers upper than the pixel defining layer 253 and the convex structural part 257RB from the configuration in FIG. 2C. The pixel defining layer 253 has a side wall (first side wall) 531R and a side wall (second side wall) 531B in the groove 255RB. The side walls 531R and 531B are inner faces of the groove 255RB. The side wall 531R is a side wall closer to the red sub-pixel 251R and the side wall 531B is a side wall closer to the blue sub-pixel 251B.

The pixel defining layer 253 has a side wall 533R (fifth side wall) on the back of the side wall 531R and a side wall 533B (sixth side wall) on the back of the side wall 531B. The side wall 533R faces a red sub-pixel (light-emitting region) 251R and defines one side of the red sub-pixel 251R and the side wall 533B faces a blue sub-pixel (light-emitting region) 251B and defines one side of the blue sub-pixel 251B. The distance W1 between the side wall 531R and the side wall 533R is represented by a full width at half maximum of the mound of the pixel defining layer 253. The same applies to the distance between the side walls 531B and 533B.

In the example of FIG. 2D, the side wall 533R has a forward tapered surface and its taper angle is substantially the same as the taper angle of the side wall 531R. The side wall 533B has a forward tapered surface and its taper angle is substantially the same as the taper angle of the side wall 531B.

A convex structural part 257RB is provided in the groove 255RB formed in the pixel defining layer 253. The convex structural part 257RB is distant from both of the side wall 531R and the side wall 531B. The convex structural part 257RB has a side wall (third side wall) 571R closer to the red sub-pixel 251R and a side wall (fourth side wall) 571B closer to the blue sub-pixel 251B.

The side wall 571R of the convex structural part 257RB faces the side wall 531R of the pixel defining layer 253. The side wall 571B of the convex structural part 257RB faces the side wall 531B of the pixel defining layer 253.

The distance W2 between the side wall 531R and the side wall 531B is represented by a full width at half maximum of the convex structural part 257RB. In an example, the distance (width) W2 is smaller than the distance (width) W1.

The side walls 531R and 531B of the pixel defining layer 253 have forward tapered surfaces. The taper angle $\theta 1$ of the side wall 531R is an acute angle, which is larger than 0 degrees and smaller than 90 degrees. The same applies to the taper angle of the side wall 531B. In the example of FIG. 2D, the taper angles of the side walls 531R and 531B are substantially the same. The side walls 571R and 571B of the convex structural part 257RB have forward tapered surfaces. The taper angle $\theta 2$ of the side wall 571R is an acute angle, which is larger than 0 degrees and smaller than 90 degrees. The same applies to the taper angle of the side wall 571B.

In an example, the taper angles of the side walls 571R and 571B of the convex structural part 257RB are larger than the taper angles of the side walls 531R and 531B of the pixel defining layer 253. The taper angles of the side walls 571R and 571B of the convex structural part 257RB are preferably not less than 60 degrees. The reason why the preferable taper angle is not less than 60 degrees will be described with FIGS. 7 to 9.

As illustrated in FIG. 2C, the lower interlayer 267 is provided upper than and in contact with the anode electrodes 265R and 265B, the pixel defining layer 253, and the convex structural part 257RB. As will be described layer, the lower interlayer 267 is a common layer to be formed at once for all sub-pixels and the lower interlayer for one sub-pixel is a part of the common layer.

In the example of FIG. 2C, the lower interlayer 267 is separated at the side walls 571R and 571B of the convex structural part 257RB. That is to say, there is an interval between the lower interlayer of the red sub-pixel 251R and the lower interlayer of the blue sub-pixel 251B. The separation of the lower interlayer 267 prevents carrier leakage between the sub-pixels (OLED elements) 251R and 251B for different colors through the lower interlayer 267.

The lower interlayer 267 does not need to be separated at the convex structural part 257RB. Since the lower interlayer 267 is provided on the surface of the convex structural part 257RB, the path of the carrier leakage needs to climb up and down the convex structural part 257RB. Compared to the case of no convex structural part 257RB, the carrier leakage path is long. For this reason, the carrier leakage between the sub-pixels (OLED elements thereof) 251R and 251B for different colors through the lower interlayer 267 is smaller.

As described above, the taper angle $\theta 2$ of the side walls of the convex structural part 257RB in the groove is larger than the taper angle $\theta 1$ of the side walls of the pixel defining layer 253 in the groove. This configuration achieves elongation of the carrier leakage path or separation of the lower interlayer 267 with the large taper angle $\theta 2$ of the convex structural part 257RB, while achieving an appropriate taper angle $\theta 1$ of the pixel defining layer 253 to form OLED elements.

When the taper angle $\theta 2$ of the convex structural part 257RB is larger, the possibility of separation of the lower interlayer 267 is higher. According to the research by the inventors, the lower interlayer 267 is separated with few exceptions when the taper angle $\theta 2$ is not less than 80 degrees. In the experiment conducted by the inventors, an incline having a taper angle of 80 degrees separated a 15-nm MgAg layer deposited by vacuum vapor deposition.

The shape of a film mostly depends on the forming method rather than the material; accordingly, the lower interlayer 267 is separated by an incline having a taper angle of 80 degrees, like the MgAg layer. As understood from this, it is preferable that the taper angle be between 80 degrees and 90 degrees to separate the lower interlayer. If the lower interlayer does not need to be separated as mentioned above, the taper angle $\theta 2$ can be less than 80 degrees and preferably, not less than 60 degrees, for example.

When the taper angle $\theta 2$ is not less than 60 degrees and less than 80 degrees, the lower interlayer 267 formed on the incline becomes thin. In other words, the lower interlayer 267 formed on the incline at a taper angle $\theta 2$ not less than 60 degrees and less than 80 degrees is thin enough to prevent carrier leakage. As a result, diminishment of the leakage path is achieved.

Directly above the lower interlayer 267, namely, in contact with the lower interlayer 267, the organic light-emitting layers 269R and 269B are provided. In the example of FIG. 2C, each of the organic light-emitting layers 269R and 269B is provided above the convex structural part 257RB to cover the convex structural part 257RB. The organic light-emitting layers 269R and 269B do not need to exist above the convex structural part 257RB but can be separate.

Forming the organic light-emitting layers to cover the groove provided between adjacent sub-pixels makes the films stacked on the convex structural part thicker, reducing the possibility that the cathode electrode layer of the stacked films will be separated by the convex structural part.

An upper interlayer 271 is provided above and in contact with the organic light-emitting layers 269R and 269B. The upper interlayer 271 is a layer common to all sub-pixels. In the example of FIG. 2C, the upper interlayer 271 is not separated at the convex structural part 257RB but is continuous in the two sub-pixels 251R and 251B. The upper interlayer 271 may be separated at the convex structural part 257RB. The upper interlayer may be formed separately for the sub-pixels for the same color.

A cathode electrode 273 is provided above and in contact with the upper interlayer 271. The cathode electrode 273 is a layer common to all sub-pixels. In the example of FIG. 2C, the cathode electrode 273 is not separated at the convex structural part 257RB but is continuous in the two sub-pixels 251R and 251B.

As described above, the side walls 571R and 571B of the convex structural part 257RB have forward tapered surfaces and therefore, achieve low possibility of separation of the upper interlayer 271 and the cathode electrode 273 common to all sub-pixels at the convex structural part 257RB. The upper interlayer 271 and the cathode electrode 273 are layers upper than the lower interlayer 271 and therefore, the possibility of separation thereof is much low, compared to the lower interlayer 267.

The substantial leakage path for carrier leakage between sub-pixels for different colors is generated on the lower interlayer 267. Accordingly, the forward tapered convex structural part achieves small carrier leakage between sub-pixels for different colors and further, low possibility of separation of the layers upper than the organic light-emitting layer.

FIGS. 2C and 2D illustrate the configuration of a convex structural part 257RB between a red sub-pixel 251R and a blue sub-pixel 251B and the proximity thereof. The foregoing description provided with reference to FIGS. 2C and 2D is applicable to every sub-pixel pair consisting of sub-pixels for different colors that are adjacent in the row direction.

Manufacturing Method

An example of a method of manufacturing the OLED display device 10 is described. As will be described later, this disclosure is characterized by formation of the pixel defining layer and the convex structural parts. In the following description, the elements formed in the same step (together) are the elements on the same layer.

The method of manufacturing of the OLED display device 10 first forms a TFT circuit layer 263 on an insulating substrate 261. Forming the TFT circuit layer 263 can employ a known technique and detailed description is omitted herein. Next, the method forms anode electrodes above the TFT circuit layer 263. For example, the method forms anode electrodes by sputtering on a planarization film having contact holes.

An anode electrode includes three layers of a transparent film made of ITO, IZO, ZnO, $In_2O_3$, or the like, a reflective film made of Ag, Mg, Al, Pt, Pd, Au, Ni, Nd, Ir, Cr, or a metallic compound thereof, and another transparent film as mentioned above. The anode electrode can have any layer structure. The anode electrode is connected with a pixel circuit on the TFT circuit layer 263 through a contact.

Next, the method deposits a photosensitive organic resin by spin coating and patterns the photosensitive organic resin to form a pixel defining layer 253 and convex structural parts. The pixel defining layer 253 and the convex structural parts are elements on the same layer formed together using the same material. The patterning creates openings in the pixel defining layer 253 so that the anode electrodes of the sub-pixels are exposed at the bottom of the created openings. The side walls of the openings in the pixel defining layer 253 have forward tapered surfaces. The pixel defining layer 253 forms separate sub-pixels (light-emitting regions).

Further in the pixel defining layer 253, the method creates grooves between openings for sub-pixels. The method creates a convex structural part in each groove in the pixel defining layer 253. The structures of the grooves and the convex structural parts of the pixel defining layer 253 have been described with reference to FIGS. 2A to 2D. The details of the patterning of the pixel defining layer 253 and the convex structural parts will be described later.

Next, the method deposits the material for the lower interlayer 267 on the insulating substrate 261 provided with the pixel defining layer 253 and the convex structural parts to form the lower interlayer 267. During the formation of the lower interlayer 267, the lower interlayer 267 can be separated at the convex structural parts. The lower interlayer 267 is formed on the entire display region 125 at once for all sub-pixels.

The reason why the lower interlayer 267 is separated is described specifically with reference to FIGS. 2C and 2D. In FIGS. 2C and 2D, the angles of the side walls 571R and 571B of a convex structural part 257 are not less than 80 degrees, as already described. In other words, the side walls 571R and 571B of the convex structural part 257 are steep. In forming the lower interlayer 267 on the entire display region 125 in the state of FIG. 2D by vacuum vapor deposition, for example, the possibility that the material of the lower interlayer 267 will become (namely be deposited into) a continuous film on the steep side walls 571R and 571B is low. In other words, the lower interlayer 267 is physically separated by the convex structural part 257.

Alternatively, even if the lower interlayer 267 is formed continuously on the side walls 571R and 571B, the lower interlayer 267 on the side walls 571R and 571B will be thin because it is difficult for the material of the lower interlayer 267 to stay on these steep side walls 571R and 571B. Accordingly, the lower interlayer 267 has high resistance at this thin part. Furthermore, the leakage path in the lower interlayer 267 is elongated. Because of the high resistance and the elongated leakage path, it is difficult for the carriers to flow between adjacent sub-pixels through the interlayer. That is to say, the convex structural part 257 electrically separates the lower interlayer 267.

Since the lower interlayer 267 is formed on the entire display region 125, in other words, since the lower interlayer 267 is not formed separately for individual sub-pixels, a metal mask for forming the lower interlayer 267 for individual pixels is unnecessary. As a result, the manufacturing cost can be saved.

Next, the method deposits organic light-emitting materials onto the lower interlayer 267 to form organic light-emitting layers. The method selectively applies organic light-emitting materials for the colors of red, green, and blue to the anode electrodes to form the organic light-emitting layers. Forming the organic light-emitting layers uses metal masks. The metal masks are prepared individually for the patterns of sub-pixels for different colors. The method vapor-deposits the organic light-emitting material onto the places corresponding to the sub-pixels on the TFT substrate 100 through the openings of a metal mask.

As illustrated in FIG. 2C, the manufacturing step in this example to form a light-emitting layer for a specific color vapor-deposits the organic light-emitting material for the sub-pixels onto areas (also referred to as selective vapor deposition margins) larger than the openings provided in the pixel defining layer 253, considering the conditions such as the precision in pattern of the metal mask, the deformation of the metal mask by heat in forming the film, the precision in alignment of the metal mask with the TFT substrate 100, and the incident angles of the evaporated molecules.

Particularly, the manufacturing step in this example forms the organic light-emitting layer so that the layer covers the convex structural part provided between adjacent sub-pixels. As a result, the film thickness between the convex structural part and the cathode electrode increases enough to prevent separation of the cathode electrode 273 by the convex structural part having a large taper angle.

Next, the method deposits the material for the upper interlayer 271 on the organic light-emitting layers to form the upper interlayer 271. The upper interlayer 271 is formed on the entire display region 125 at once for all the sub-pixels. The upper interlayer 271 further increases the film thickness upper than the convex structural parts.

Next, the method deposits the metallic material for the cathode electrode 273 on the upper interlayer 271. The cathode electrode 273 is formed on the entire display region 125 at once for all the sub-pixels. The cathode electrode 271 is formed by vapor deposition of Li, Ca, LiF/Ca, LiF/Al, Al, Mg, or an alloy thereof, for example. To increase the light extraction efficiency, a cap layer may be formed by depositing an insulator having a refractive index higher than glass after forming the cathode electrode 271.

Next, the method applies glass frit to the periphery of the TFT substrate 100, places an encapsulation substrate 200 thereon, and heats and melts the glass frit with a laser beam to seal the TFT substrate 100 and the encapsulation substrate 200.

Figure 3A:
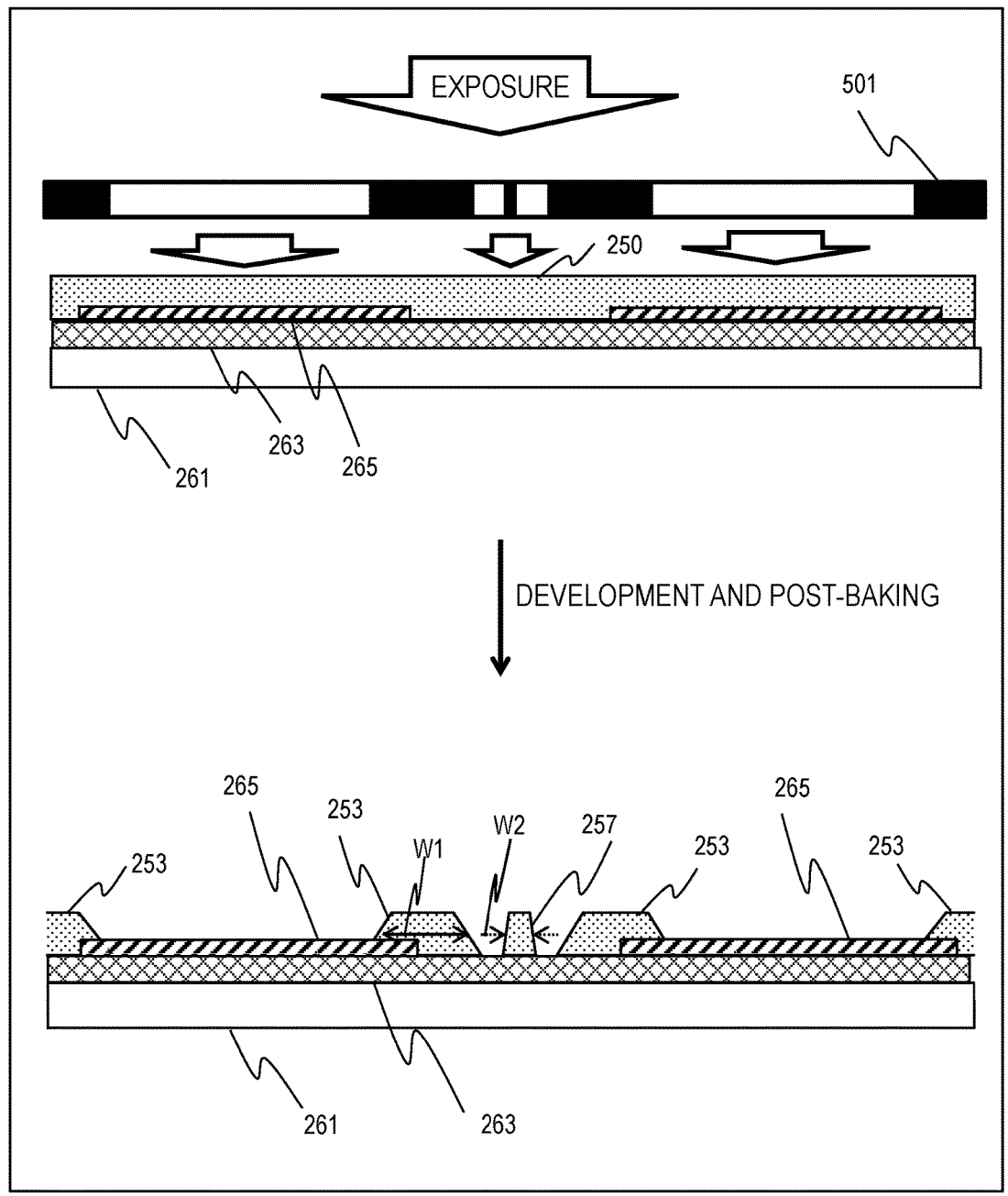
FIG. 3A schematically illustrates a step of forming a pixel defining layer and convex structural parts.

Hereinafter, the step of forming the pixel defining layer 253 and convex structural parts are described. FIG. 3A schematically illustrates the step of forming the pixel defining layer 253 and convex structural parts. This step applies a photoresist layer 250 onto the insulating substrate 261 with the TFT circuit layer 263 and the anode electrodes 265 formed thereon. The photoresist layer 250 can be a positive photoresist.

Next, the step exposes the photoresist layer 250 to the light through a mask 501. The resolvability of the parts exposed to the light increases. The development process removes the parts exposed to the light with developer. Through the development process, the pattern of the pixel defining layer 253 and convex structural parts 257 are formed on the photoresist layer 250.

The photoresist layer 250 is patterned so that the linewidths of the convex structural parts 257 are thinner than the linewidths of the pixel defining layer 253. The linewidths of the convex structural parts 257 and the linewidths of the pixel defining layer 253 can be defined with the full widths at half maximum described with reference to FIG. 2D, for example. The pixel defining layer 253 and the convex structural parts 257 formed through exposure and development have substantially the same taper angles.

After the development, the remaining photoresist pattern is heated (post-baked). The post-baking increases the taper angles of the convex structural parts 257 and maintains or reduces the taper angles of the pixel defining layer 253. As noted from this description, the pixel defining layer 253 having small taper angles and the convex structural parts 257 having large taper angles can be formed together through the single patterning.

Figure 3B:
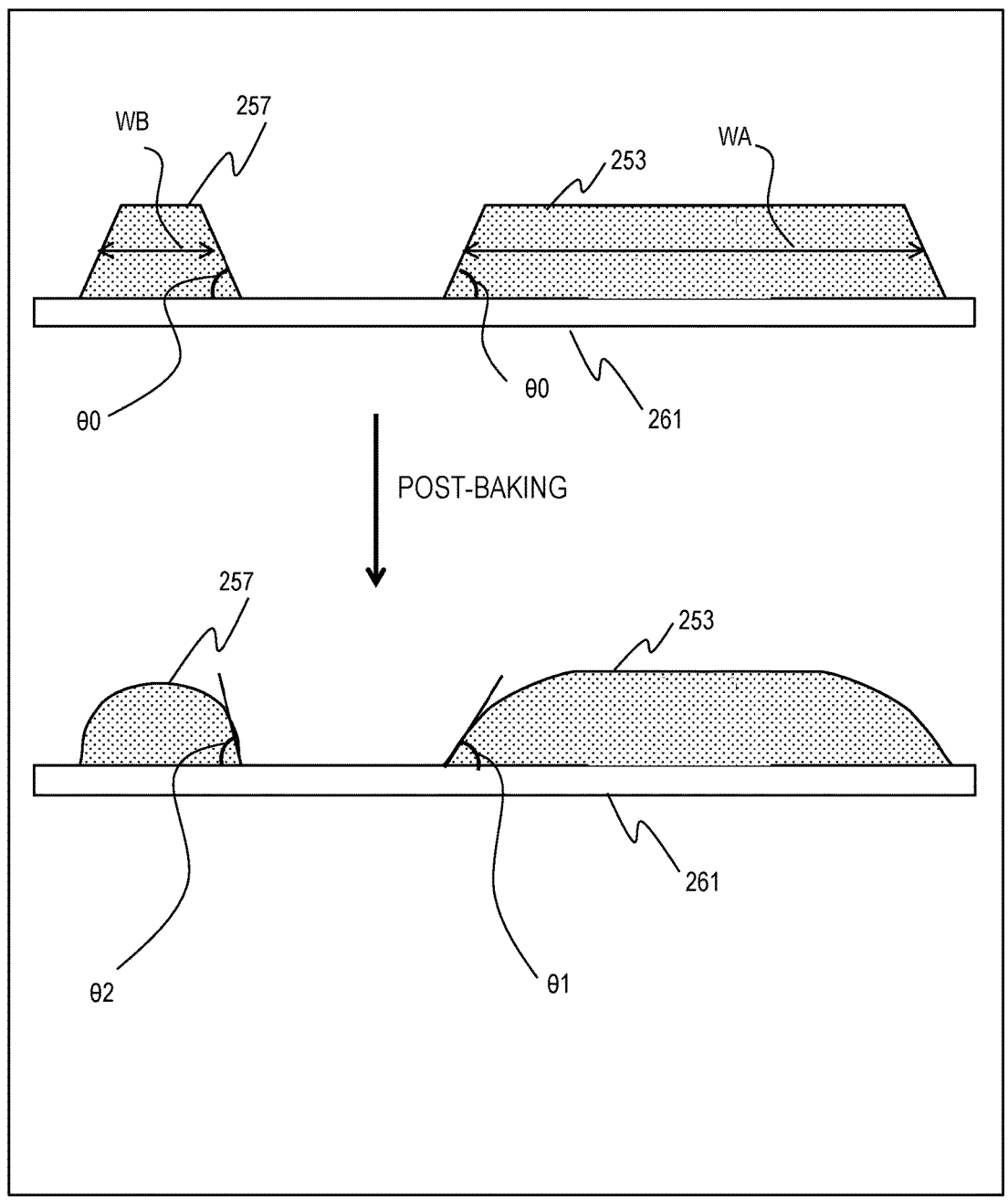
FIG. 3B schematically illustrates the change of taper angles of a pixel defining layer and a convex structural part through post-baking.

FIG. 3B schematically illustrates the change of taper angles of the pixel defining layer 253 and the convex structural part 257 through post-baking. Before the post-baking, the pixel defining layer 253 has a linewidth (a full width at half maximum) WA and the convex structural part 257 has a linewidth (a full width at half maximum) WB. The linewidth WB is thinner than the linewidth WA. The pixel defining layer 253 and the convex structural part 257 have the same taper angles $\theta 0$.

The taper angles of the photoresist 250 change with post-baking, depending on the linewidth. Specifically, as illustrated in FIG. 3B, post-baking makes patterns deform in flow so that a thinner pattern increases its taper angle because of its surface tension. A thicker pattern also deforms in such a manner that the central part pulls the ends to decrease the taper angle.

After the post-baking, the pixel defining layer 253 has a linewidth W1 and a taper angle $\theta 1$ and the convex structural part 257 has a linewidth W2 and a taper angle $\theta 2$. The linewidth W2 of the convex structural part 257 is thinner than the linewidth W1 of the pixel defining layer 253. The taper angle $\theta 2$ of the convex structural part 257 is larger than the taper angle $\theta 1$ of the pixel defining layer 253.

As described above, this step patterns the pixel defining layer 253 and the convex structural parts 257 on the same layer and under the same condition, utilizing the phenomenon that the taper angles change differently depending on the width of the pattern through post-baking. The taper angle of the pixel defining layer 253 is determined to be appropriate for formation of OLED elements. Controlling the linewidth of the convex structural part 257 enables the convex structural part 257 to have a desired taper angle and further, the convex structural parts 257 and the pixel defining layer 253 to be formed together.

The photoresist to be used can be a negative type. The convex structural parts 257 can be formed as a layer different from the pixel defining layer 253 and can be made of a material different from the material of the pixel defining layer 253.

Other Configuration Examples

Figure 4A:
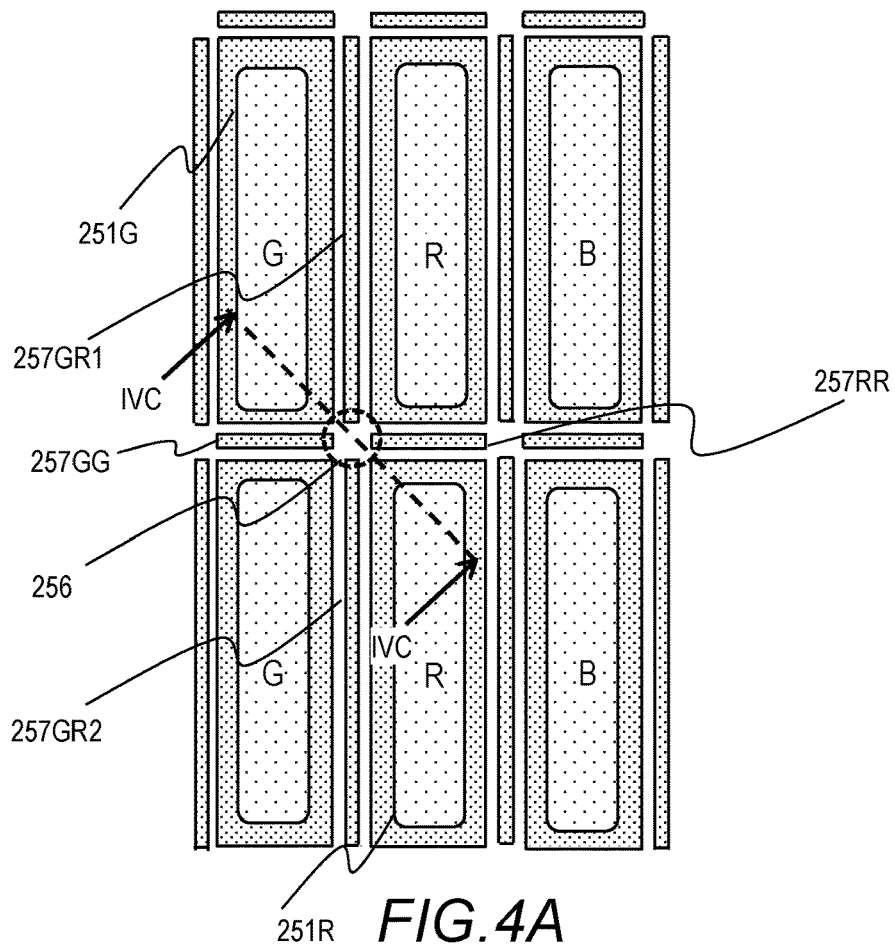
FIG. 4A is a plan diagram of a part of a display region.
Figure 4B:
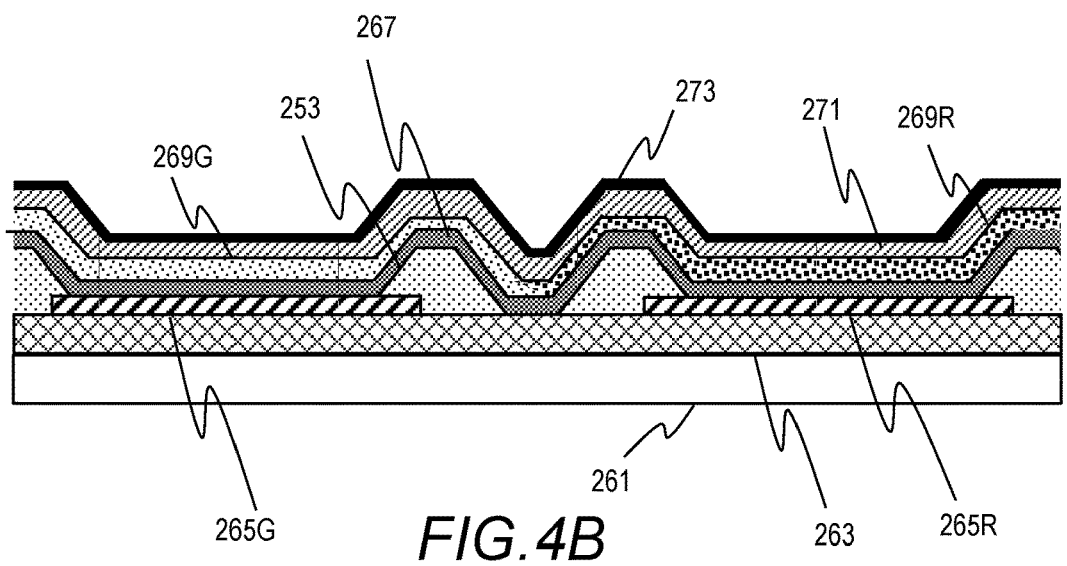
FIG. 4B is a cross-sectional diagram cut along the line IVB-IVB in FIG. 4A.

Hereinafter, other configuration examples of the display region 125 are described. FIG. 4A is a plan diagram of a part of a display region 125. FIG. 4B is a cross-sectional diagram cut along the line IVB-IVB in FIG. 4A. In the following, differences from the configuration example described with reference to FIGS. 2A to 2D are mainly described.

As illustrated in FIG. 4A, a plurality of not continuous but separate convex structural parts are disposed to surround each sub-pixel. A convex structural part is disposed along one of the four sides of a sub-pixel. Each convex structural part is isolated.

In the following description, sub-pixels adjacent in the row direction or column direction are referred to as axially-adjacent sub-pixels. Sub-pixels adjacent in the diagonal direction are referred to as diagonally-adjacent sub-pixels. In each sub-pixel pair consisting of axially-adjacent sub-pixels, an island-like convex structural part is provided between the sub-pixels. There is a gap between axially-adjacent convex structural parts. For example, there is a gap between the convex structural part 257GR1 and the convex structural part 257GR2 and there is a gap between the convex structural part 257GG and the convex structural part 257RR.

There is no convex structural part opposed to a corner of a sub-pixel. For example, the area 256 in FIG. 4A between two diagonally-adjacent sub-pixels 251G and 251R includes a gap between convex structural parts. This gap is described with reference to a cross-sectional diagram. As illustrated in FIG. 4B, a groove in the pixel defining layer 253 lies between the two diagonally-adjacent sub-pixels 251G and 251R. However, there is no convex structural part on the line connecting the corners of the sub-pixels 251G and 251R. In other words, the convex structural part (for example, 257GR1, 257GG, 257RR) is provided in an area outside of an area between sub-pixels adjacent in the diagonal direction.

A technique to increase the luminance is thinning the cathode electrode 273 to raise the transmittance of the cathode electrode 273. A thinner cathode electrode 273 increases the possibility of separation of the cathode electrode 273 at a convex structural part. The gap between convex structural parts provides an area where the cathode electrode 273 is unseparated. This configuration prevents formation of isolated island-like areas of the cathode electrode 273 and achieves low resistance in the cathode electrode 273.

The area without a convex structural part can become a path of carrier leakage between sub-pixels. However, most of the carrier leakage paths are separated by convex structural parts and accordingly, less cross talk between sub-pixels can be achieved.

The configuration examples shown in FIGS. 2A and 4A have grooves in the pixel defining layer 253 between sub-pixels for the same color and further, convex structural parts in the grooves. Instead of this configuration, the grooves and the convex structural parts between sub-pixels for the same color can be omitted. In the configuration examples illustrated in FIGS. 2A and 4A, a groove between sub-pixels is continuous to other grooves. Instead of this configuration, a groove between sub-pixels may be separated from other grooves. A plurality of grooves may be provided between sub-pixels in the direction along or perpendicular to a side of a sub-pixel.

A plurality of separate convex structural parts may be provided between adjacent sub-pixels for different colors. For example, two separate convex structural parts may be provided between adjacent sub-pixels for different colors to extend in the column direction and these separate convex structural parts may be overlapped with each other when seen in the row direction. For example, a plurality of convex structural parts may be staggered between sub-pixels.

As illustrated in FIGS. 2A and 4A, a convex structural part extends along a side of a sub-pixel to the both ends of the side. Between the opposite sides of axially-adjacent sub-pixels for different colors, a given straight line crosses the convex structural part. This configuration cuts a short carrier leakage path between the sub-pixels or effectively elongates the carrier leakage path. The convex structural part may be shorter than the opposite sides of the axially-adjacent sub-pixels. The convex structural part may have the same or different height from the pixel defining layer.

In the configuration example illustrated in FIG. 2A or 4A, an auxiliary electrode may be provided above the cathode electrode 273. The auxiliary electrode reduces the resistance of the cathode electrode 273 to increase the uniformity of the brightness. The auxiliary electrode can fill holes in the cathode electrode 273, if such holes are generated, to efficiently supply electric current to all sub-pixels.

Figure 5:
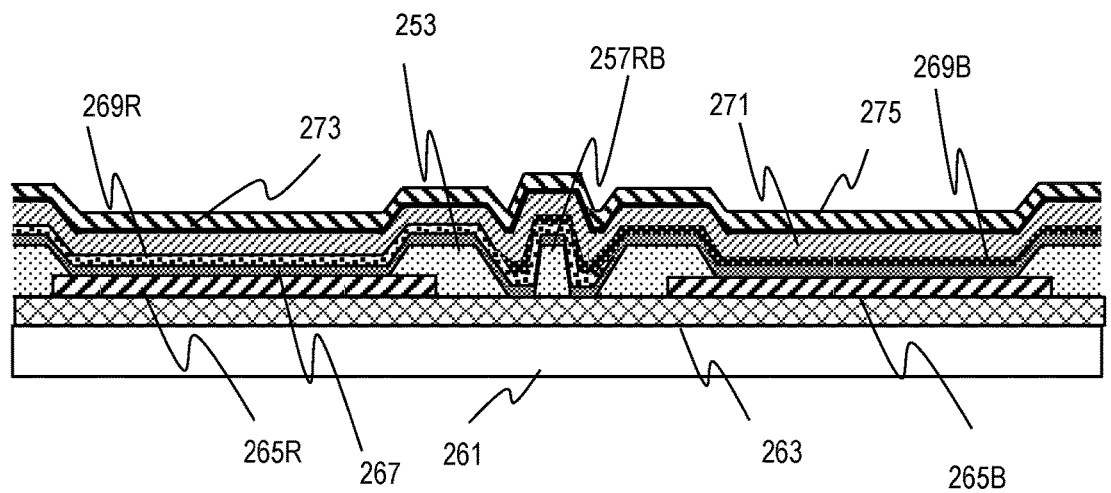
FIG. 5 illustrates an example of an auxiliary electrode.

FIG. 5 illustrates an example of the auxiliary electrode. The auxiliary electrode (layer) 275 is a transparent electrode and is formed on the cathode electrode 273 over the entire display region 125. The auxiliary electrode 275 can be made of a material for a transparent electrode, such as ITO, IZO, ZnO, or $In_2O_3$. In a configuration like the configuration example illustrated in FIGS. 2A to 2D where each sub-pixel is surrounded by a continuous groove in the pixel defining layer 253 and convex structural parts, an island-like area may be generated in the layer of the cathode electrode 273. The auxiliary electrode 275 connects the island-like area to the other area, enabling the sub-pixel to emit light properly.

Figure 6:
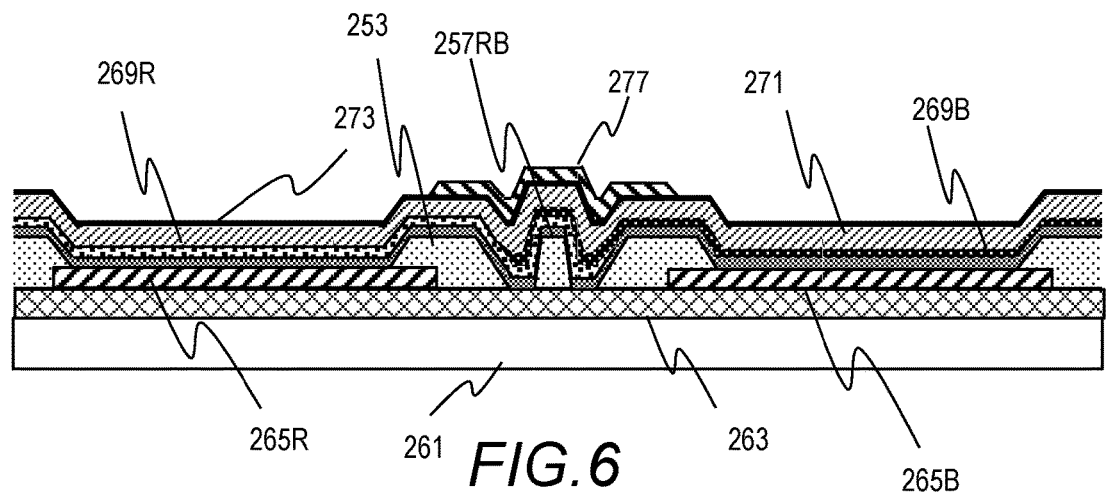
FIG. 6 illustrates another example of an auxiliary electrode.

FIG. 6 illustrates another example of the auxiliary electrode. Unlike the auxiliary electrode 275 in FIG. 5, the auxiliary electrode 277 is provided only outside of the sub-pixel (light-emitting region) or the areas between sub-pixels. The auxiliary electrode 277 illustrated in FIG. 6 is one of a plurality of separate electrodes in an auxiliary electrode layer or a part of one continuous auxiliary electrode layer.

The auxiliary electrode 277 is provided above and in contact with the cathode electrode layer, and is provided to cover at least a part of each convex structural part between sub-pixels. Since the auxiliary electrode 277 is provided outside of the sub-pixels (light-emitting regions), the auxiliary electrode 277 does not need to be transparent. Even in the case where some area of the cathode electrode 273 of the sub-pixel is separated from the other area, the auxiliary electrode 277 connects the partial area to the other area, enabling the sub-pixel to emit light properly.

Leakage Path Diminishing Effect

Figure 7A:
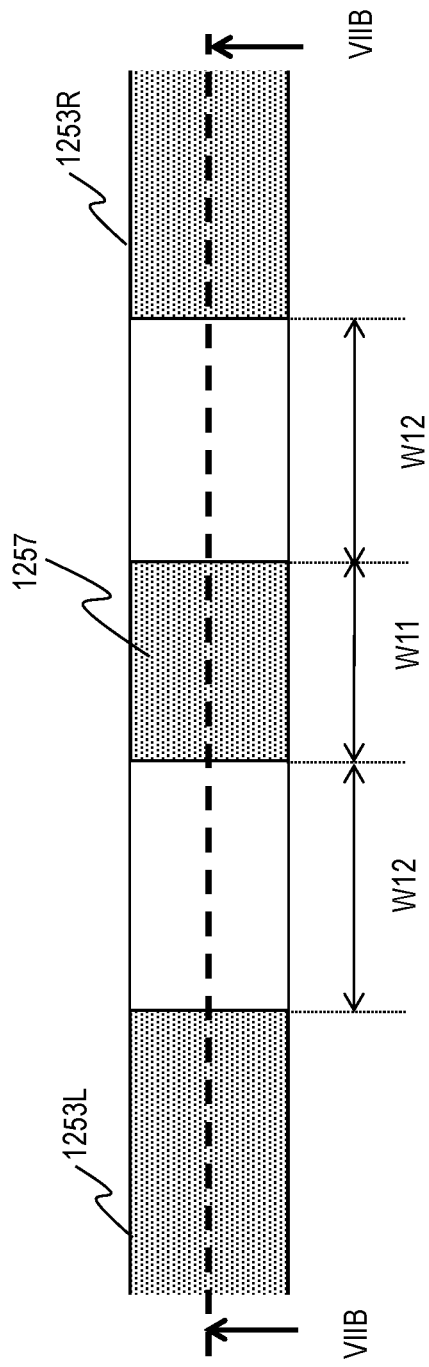
FIG. 7A is a plan diagram of a part of the pixel defining layer and a convex structural part formed on the substrate and post-baked.
Figure 7B:
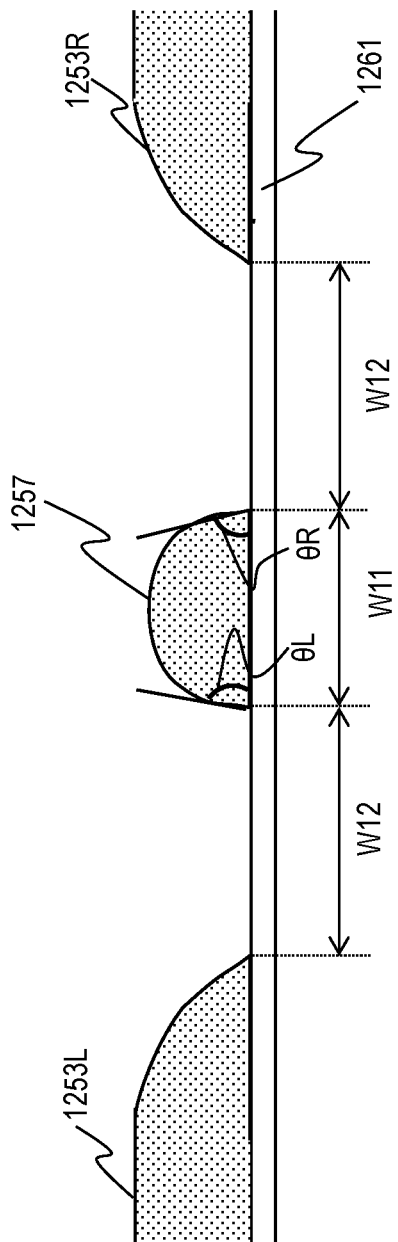
FIG. 7B is a cross-sectional diagram cut along the line VIIB-VIIB in FIG. 7A.

In the following, the reason why the leakage path is diminished when the taper angle of the convex structural part is not less than 60 degrees and less than 80 degrees is described. FIG. 7A is a plan diagram of a part of the pixel defining layer and a convex structural part formed on the substrate and post-baked. FIG. 7B is a cross-sectional cut along the line VIIB-VIIB in FIG. 7A.

As illustrated in FIGS. 7A and 7B, a pixel defining layer 1253L, a pixel defining layer 1253R, and a convex structural part 1257 are formed on the substrate 1261 through post-baking. The width of the convex structural part 1257 is W11. The interval between the convex structural part 1257 and the left pixel defining layer 1253L and the interval between the convex structural part 1257 and the right pixel defining layer 1253R are both W12. The right taper angle and the left taper angle of the convex structural part 1257 in the cross-section are denoted by reference signs θR and θL, respectively.

Figure 8A:
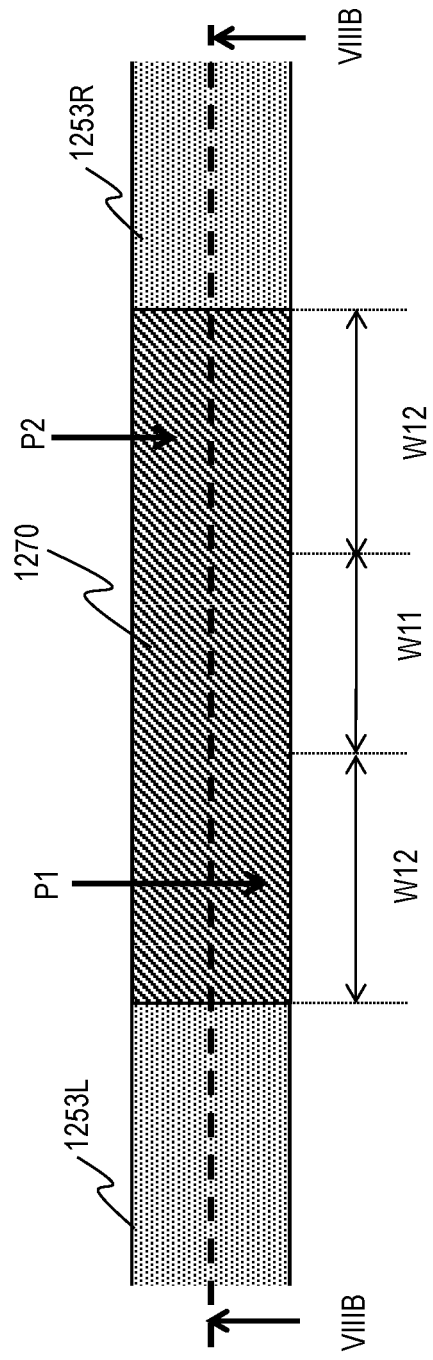
FIG. 8A is a plan diagram for illustrating a MgAg layer provided over the gaps between a part of the pixel defining layer and a convex structural part and the entire convex structural part.
Figure 8B:
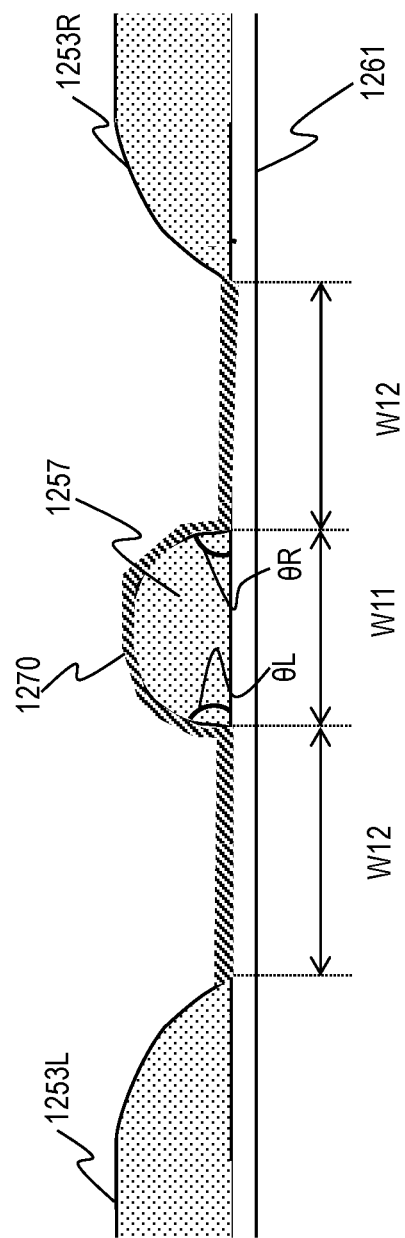
FIG. 8B is a cross-sectional diagram cut along the line VIIIB-VIIIB in FIG. 8A.

Hereinafter, the combination of the post-baked pixel defining layer 1253L, pixel defining layer 1253R, and convex structural part 1257 is referred to as test pattern for examining diminishment of leakage path. In order to examine the leakage path diminishing effect, the inventors prepared a plurality of test patterns each including a convex structural part 1257 having a different shape with a MgAg layer 1270 thereon formed by vacuum vapor deposition, as illustrated in FIGS. 8A and 8B. The thickness of the MgAg layer is approximately 10 nm, for example.

FIG. 8A is a plan diagram for illustrating the MgAg layer provided over the gaps between a part of the pixel defining layer and the convex structural part and the entire convex structural part. FIG. 8B is a cross-sectional diagram cut along the line VIIIB-VIIIB in FIG. 8A. Although the actual MgAg layer partially covers the inclines of the pixel defining layers 1253L and 1253R, the overlaps are omitted from the drawings for convenience of explanation.

The MgAg layer is an electrically conductive film to be used to examine the diminishment of the leakage path, as a replacement of the interlayer (such as the lower interlayer). The inventors applied a voltage between the arrows P1 and P2 with a prober and measured the current-voltage (I-V) characteristic to examine the diminishment of leakage path.

FIG. 9 is a table showing the results of examining the diminishment of leakage path by measuring the current-voltage characteristics of a plurality of test patterns with a vacuum vapor deposited MgAg layer. The table of FIG. 9 has columns of test patterns, left taper angles (θL), right taper angles (θR), and leakage path diminishing effect.

A test pattern field indicates the number to identify a test pattern. A left taper angle (θL) field indicates the left taper angle of the convex structural part 1257 of the test pattern identified by the number and a right taper angle (θR) field indicates the right taper angle of the convex structural part 1257 of the test pattern identified by the number. The leakage path diminishing effect field indicates whether the test pattern identified by the number has leakage path diminishing effect.

For example, the test pattern 1 including the convex structural part 1257 having a left taper angle (θL) of 50 degrees and a right taper angle (θR) of 46 degrees does not have leakage path diminishing effect. The test pattern 2 including the convex structural part 1257 having a left taper angle (θL) of 60 degrees and a right taper angle (θR) of 56 degrees has leakage path diminishing effect.

As noted from FIG. 9, when either the left taper angle θL or the right taper angle θR is 60 degrees or more, the leakage path diminishing effect was observed. The reason why the leakage path diminishing effect was observed is described. When the convex structural part has a larger taper angle, MgAg is more difficult to deposit on the taper part (incline) of the convex structural part 1257 in vacuum vapor deposition, so that MgAg deposited on the incline is thinner.

For this reason, the electrical resistance of the MgAg film deposited on the incline increases (in other words, the leakage current becomes difficult to flow). When either the left taper angle θL or the right taper angle θR is 60 degrees or more, the thickness of the MgAg film on the incline becomes thin enough to prevent generation of crosstalk. Accordingly, the leakage path diminishing effect is generated. As described with FIG. 2C, when the taper angle of the convex structural part is between 80 degrees and 90 degrees, the MgAg film is separated.

The widths W11 in the patterns 1 to 3 are 3 μm; the widths W11 in the patterns 4 to 6 are 4 μm; and the width W11 in the patterns 7 to 9 are 5 μm·However, these widths are merely examples. The distances W12 in the patterns 1, 4, and 7 are 3 μm; the distances W12 in the patterns 2, 5, and 8 are 4 μm; and the distances W12 in the patterns 3, 6, and 9 are 5 μm. These distances are also merely examples.

Providing convex structural parts may cause electrical separation of the cathode electrode when an electrically conductive film for the cathode (cathode electrode) is deposited by vapor deposition. A way to check whether the cathode electrode is electrically separated at the top of a convex structural part described.

In an OLED display panel, a plurality of sub-pixels included in each of the main pixels arrayed in a matrix each have an anode electrode and further, a cathode electrode. Each sub-pixel has a light-emitting layer of an organic light-emitting material between the anode electrode and the cathode electrode. This cathode electrode is formed over the entire display region to integrally cover the organic light-emitting materials of the sub-pixels. The cathode electrode is connected with a power line through a contact hole (so-called cathode contact) at the outer periphery of the display panel. Accordingly, whether the cathode electrode is separated can be examined by measuring the conductivity between the cathode contact and each anode electrode.

The display region 125 described above has a top-emission pixel structure. The top-emission pixel structure is configured to provide a cathode electrode 273 common to a plurality of pixels on the light emission side (the upper side of the drawings). The cathode electrode 273 has a shape that completely covers the entire display region 125. The feature of this disclosure is applicable to OLED display devices having a bottom-emission pixel structure. The bottom-emission pixel structure has a transparent anode electrode and a reflective cathode electrode and emits light to the external through the TFT substrate 100.

As set forth above, embodiments of this invention have been described; however, this invention is not limited to the foregoing embodiments. Those skilled in the art can easily modify, add, or convert each element in the foregoing embodiments within the scope of this invention. A part of the configuration of one embodiment may be replaced with a configuration of another embodiment or a configuration of an embodiment may be incorporated into a configuration of another embodiment.

What is claimed is:

1. An OLED display device comprising:
    a substrate;
    a plurality of sub-pixels arrayed on the substrate;
    a pixel defining layer provided to surround each of the plurality of sub-pixels, the pixel defining layer having a groove formed between a first sub-pixel and a second sub-pixel for different colors adjacent to each other; and
    a convex structural part formed in the groove, the convex structural part being distant from a first side wall of the pixel defining layer in the groove on a side of the first sub-pixel and a second side wall of the pixel defining layer in the groove on a side of the second sub-pixel,
    wherein each of the plurality of sub-pixels includes an upper electrode layer, a lower electrode layer between the upper electrode layer and the substrate, an organic light-emitting layer between the lower electrode layer and the upper electrode layer, and an interlayer between the organic light-emitting layer and the lower electrode layer,
    wherein the pixel defining layer is provided between the lower electrode layer and the interlayer,
    wherein the convex structural part is provided between the substrate and the interlayer,
    wherein the convex structural part has a third side wall on the side of the first sub-pixel and a fourth side wall on the side of the second sub-pixel, and
    wherein the first side wall, the second side wall, the third side wall, and the fourth side wall are comprised of forward tapered surfaces.

2. The OLED display device according to claim 1, wherein taper angles of the third side wall and the fourth side wall of the convex structural part are larger than taper angles of the first side wall and the second side wall.

3. The OLED display device according to claim 1, wherein the taper angles of the third side wall and the fourth side wall of the convex structural part are not less than 60 degrees.

4. The OLED display device according to claim 1, wherein the pixel defining layer and the convex structural part are parts of the same layer.

5. The OLED display device according to claim 4,
    wherein the pixel defining layer has a fifth side wall that is provided on the back of the first side wall and is an inner wall of an opening defining the first sub-pixel and a sixth side wall that is provided on the back of the second side wall and is inner wall of an opening defining the second sub-pixel, and
    wherein a distance between the third side wall and the fourth side wall is smaller than both of a distance between the first side wall and the fifth side wall and a distance between the second side wall and the sixth side wall.

6. The OLED display device according to claim 1,
    wherein each of the upper electrodes of the plurality of sub-pixels is a part of one continuous electrode layer,
    wherein the interlayers of the plurality of sub-pixels form a common layer, and
    wherein the interlayer is separated between the first sub-pixel and the second sub-pixel by at least either one of the third side wall and the fourth side wall.

7. The OLED display device according to claim 1,
    wherein the plurality of sub-pixels are arrayed in a matrix, and
    wherein the convex structural part is provided in an area outside of an area between diagonally-adjacent sub-pixels.

8. The OLED display device according to claim 1,
    wherein the upper electrode layer is a cathode electrode layer and the lower electrode layer is an anode electrode layer, and
    wherein the OLED display device further comprises an auxiliary electrode provided above and in contact with the cathode electrode layer and covering at least the convex structural part.

9. A method of manufacturing an OLED display device, comprising:

a first step of forming a lower electrode layer including a plurality of separate lower electrodes on a substrate, the lower electrodes corresponding to individual sub-pixels;

a second step of forming a pixel defining layer having openings to expose the lower electrodes and grooves between openings, inner walls of the openings and the grooves having forward tapered surfaces;

a third step of forming convex structural parts in the grooves, side walls of the convex structural parts having forward tapered surfaces;

a fourth step of forming an interlayer over the pixel defining layer and the convex structural parts;

a fifth step of forming organic light-emitting layers for different colors on the interlayer in such a manner that each convex structural part is located between organic light-emitting layers for different colors; and a sixth step of forming an upper electrode layer over the organic light-emitting layers.

10. The method according to claim 9, wherein the second step and the third step are performed together as a single step, and wherein the single step further includes:
   applying a photoresist on the substrate with the lower electrode layer formed thereon;
   exposing and developing the photoresist to form the pixel defining layer and the convex structural parts narrower in linewidth than the pixel defining layer; and
   performing post-baking after the exposure and the development.

11. The method according to claim 9, further comprising a step of forming an auxiliary electrode layer above the upper electrode layer.

12. The method according to claim 10, wherein a material of the pixel defining layer and a material of the convex structural part are the same material.

* * * * *